United States Patent
Huerner et al.

(10) Patent No.: US 9,893,057 B2
(45) Date of Patent: Feb. 13, 2018

(54) MONOLITHICALLY INTEGRATED SEMICONDUCTOR SWITCH, PARTICULARLY CIRCUIT BREAKER

(71) Applicant: FRAUNHOFER-GESELLSCHAFT ZUR FOERDERUNG DER ANGEWANDTEN FORSCHUNG E.V., Munich (DE)

(72) Inventors: Andreas Huerner, Nuernberg (DE); Tobias Erlbacher, Poxdorf (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/585,198

(22) Filed: May 3, 2017

(65) Prior Publication Data
US 2017/0323884 A1 Nov. 9, 2017

(51) Int. Cl.
*H01L 27/07* (2006.01)
*H03K 17/567* (2006.01)
(Continued)

(52) U.S. Cl.
CPC ...... *H01L 27/0705* (2013.01); *H01L 27/0266* (2013.01); *H01L 29/1608* (2013.01);
(Continued)

(58) Field of Classification Search
CPC ............. H01L 27/0705; H01L 29/8083; H01L 29/7392; H01L 29/1608; H01L 27/0266; H02H 3/08; H03K 17/567
See application file for complete search history.

(56) References Cited

U.S. PATENT DOCUMENTS 5,055,902 A * 10/1991 Lambert ............. H03F 3/45771
257/272
6,469,352 B2 10/2002 Ohshima et al. ............. 257/355

OTHER PUBLICATIONS

Rosensaft et al.; *Circuit Breaker and Safe Controller Power Switch*; Proceedings of the 19th International Symposium on Power Semiconductor Devices & ICs; May 27-30, 2007; Jeju, Korea; pp. 169-172.

(Continued)

*Primary Examiner* — David Vu
(74) *Attorney, Agent, or Firm* — Renner Kenner Greive Bobak Taylor & Weber

(57) ABSTRACT

A monolithically integrated semiconductor switch, particularly a circuit breaker, has regenerative turn-off behavior. The semiconductor switch has two monolithically integrated field effect transistors, for example a p-JFET and a n-JFET. The source electrodes of both JFETs and the well region of the n-JFET are short circuited. In addition, the gate electrodes of both JFETs and the drain electrode of the p-JFET are short-circuited via the cathode. In contrast, the well region of the p-JFET is short-circuited to the anode. In this way, a monolithically integrated semiconductor switch is created which turns off automatically when a certain anode voltage level or a certain anode current level is exceeded. The threshold values for the anode voltage and the anode current can be set by appropriate dimensioning of the elements. In this way, it is possible to achieve blocking strengths of up to 200 kV with fast response behavior.

10 Claims, 3 Drawing Sheets

(51) Int. Cl.
   *H01L 29/16*   (2006.01)
   *H01L 29/808*  (2006.01)
   *H01L 29/739*  (2006.01)
   *H01L 27/02*   (2006.01)
   *H02H 3/08*    (2006.01)
(52) U.S. Cl.
   CPC ...... *H01L 29/7392* (2013.01); *H01L 29/8083* (2013.01); *H02H 3/08* (2013.01); *H03K 17/567* (2013.01)

(56) References Cited

OTHER PUBLICATIONS

Callavik et al.; *They Hybrid HVDC Breaker: An innovation breakthrough enabling reliable HVDC grids; ABB Grid Systems*; Technical Paper; Nov. 2012.

* cited by examiner

MONOLITHICALLY INTEGRATED SEMICONDUCTOR SWITCH, PARTICULARLY CIRCUIT BREAKER

CROSS REFERENCE TO RELATED APPLICATION

The present application claims priority to Application No. DE 10 2016 207 859.3, filed in the Federal Republic of Germany on May 6, 2016, which is expressly incorporated herein in its entirety by reference thereto.

BRIEF SUMMARY

Technical Area

The present invention relates to a monolithically integrated semiconductor switch, particularly a circuit breaker, having a first and a second monolithically integrated field effect transistor, wherein a source or emitter electrode of the first field effect transistor is short circuited to a source or emitter electrode of the second field effect transistor, a drain or collector electrode of the first field effect transistor is connected to a first terminal, and a drain or collector electrode of the second field effect transistor is connected to a second terminal of the semiconductor switch.

Semiconductor switches are used as circuit breakers in order to limit and switch off an overcurrent in an electrical grid for example. If a short circuit occurs in an electrical grid, the load current is only limited by the grid's impedance. An overcurrent occurs, which gives rise to significant thermal load for the connected loads. In order to prevent this thermal load from damaging the loads, it is essential to limit and switch off the overcurrent quickly, at the same time avoiding flashovers among other hazards.

Related Art

In the field of power distribution technology, this issue was typically dealt with previously by implementing mechanical circuit breakers. Such circuit breakers are used to switch operating currents on and off and to switch short circuit currents off in the event of a fault. During normal operation, besides carrying all operating currents they must also be able to withstand the thermal and dynamic stresses arising in such situations. In the case of short circuits, the circuit breaker must interrupt the current path as quickly and safely as possible, so that downstream operating resources are not damaged or destroyed. At the same time, the cut-off point must form a perforation-proof isolating clearance between the adjacent conductors.

In mechanical circuit breakers, the contacts are disconnected from each other by means of a mechanical lever in the event of a malfunction. In this process, the current density in the contact area becomes so great that a fusible link is formed. The electric arc between the contacts created thereby initially keeps the power circuit closed. With alternating current, the electric arc ends with the voltage zero crossing. However, in order to prevent the arc from re-igniting when the voltage rises again, the arc path must be de-ionised. This is achieved by cooling the electric arc with an extinguishing agent such as $SF_6$ or with a vacuum. The switching process can last for several cycles. During the switch-off process, the current increases rapidly and continually comes close to the amplitude of the surge current depending on the switch-off duration. The amplitude magnitude is determined by the grid structure and the short-circuit power available in the grid. In such cases, the total time from detection to complete disconnection of the current path may be considerably longer than 100 ms. During this period, the overcurrent continues to flow through the downstream operating resources, and for this reason these resources must be dimensioned to sustain this overcurrent. In order to reduce the overcurrent load, the circuit breaker would have to function faster. However, a switching operation which is too fast increases the intensity of the electric arc in mechanical circuit breakers so that additional extinguishing energy is required and contact wear proceeds. Consequently, it is difficult to achieve short switching times with mechanical breakers.

Another option for solving the problems outlined above is offered by the use of semiconductor-based circuit breakers. These breakers are capable of switching off in a few microseconds. They also do not form an electrical arc, so no additional extinguishing means are needed. Since they do not include any moving parts, their exposure to wear is low and they require little maintenance, and they require little space due to their compact construction. In general, such a circuit breaker consists of a plurality of individual elements connected in parallel or in series, particularly thyristors, GTOs and IGBTs. Since circuit breakers in this application are mostly operated in the on-state, switching losses and barrier properties may not be taken into account in a first approximation. Consequently, the significantly higher conduction losses of IGBTs render them less suitable than thyristors. Thyristors appear to be more suitable based on their low conduction losses, and they can be obtained for blocking voltages up to 8 kV. Ignition is effected with a low gate current or a light pulse. For extinguishing, the holding current must fall below a certain value. In the case of alternating current, this takes place automatically when the zero transition point is crossed. However, a certain recovery time must be maintained, during which the remaining charge carriers are removed from the space-charge region. This can take up to several hundred µs. During this time, the repeated voltage increase must be limited, because otherwise the thyristor ignites spontaneously again. On the other hand, the recovery time is prolonged by the increase of the forward current or if the temperature rises. It must also be borne in mind that the thyristor must have a continuous ignition signal because of the zero transition. In contrast to this, gate-turn-off (GTO) thyristors can be switched off by a reverse gate current. However, this cannot be achieved by means of the internal semiconductor structure alone, but an additional RCD circuit is needed to limit the repeated rise in voltage during switch-off. The problem with circuit breakers of this kind is that there is no galvanic isolation in cut-off mode. Even in cut-off mode, small reverse currents in the mA range continue to flow.

A hybrid breaker for direct current transmission is known from M. Callavik et al., "The "Hybrid HVDC Breaker. ABB Grid System", Technical Paper November 2012. This is a parallel circuit consisting of a bypass and the electrical circuit breaker based on power semiconductors to form the main switch. In normal mode, the current flows through the bypass. The bypass consists of a fast-switching mechanical disconnector and a commutator. In the event of a fault, the commutator causes the line resistance to rise so that the current is commutated to the main current path. The commutator is composed of series-connected IGBTs which increase line resistance by changing the gate voltage. After a short delay, the mechanical switch opens. The current is then interrupted by the main breaker. The entire switch-off process lasts less than 5 ms. However, the complete assembly is very complicated and expensive.

One fundamental problem in all of the solution approaches outlined in the preceding text is the complex construction of the circuit breakers. An extensive control electronics system is needed, which ultimately detracts from the reliability of the system as a whole.

A monolithically integrated semiconductor circuit breaker with a n-JFET and a p-JFET designed according to the "dual thyristor principle" is known from B. Rosensaft et al., "Circuit Breaker and Safe Controlled Power Switch", Proc. Of the 19th International Symposium on Power Semiconductor Devices & ICs, Korea 2007, pp. 169-172. In this circuit, the source electrodes of both JFETs are short-circuited to each other, the gate electrode of the p-JFET is short-circuited to the anode terminal, and the gate electrode of the n-JFET is short-circuited to the cathode terminal. Similarly to a thyristor, which maintains a high current flow with low forward voltage after overhead ignition, after actuation the dual thyristor is able to maintain a high reverse voltage with minimal reverse current. Whereas the latching thyristor is extinguished when the voltage crosses the zero transition, the dual thyristor also known as a solid state circuit breaker (SSCB), is switched on when the current crosses the zero transition. Unlike the thyristor, with the SSCB overhead blocking is possible if the current is too strong rather than overhead ignition if the voltage is too high. This means that this component can be used as a self-actuating, resettable safety element for short circuits and overcurrents in electrical power distribution. In normal operation, the phase current flows through the low-ohmic circuit breaker. If the event of a fault, the circuit breaker switches to a high-ohmic state within a few hundred µs and picks up all of the phase voltage permanently (until it is reset).

However, in a power component of such kind the maximum cathode voltage is limited by the blocking strength of the n-JFET gate electrode, and the maximum anode voltage is limited by the blocking strength of the p-JFET gate electrode. Consequently, a circuit breaker with such a design is only suitable for low voltages, particularly in the case of monolithic integration. Also, the gate potentials of the JFETs are actuated exclusively via semiconductor regions, which means that the gate electrodes cannot be actuated from the outside. Variations of such a circuit breaker for higher operating voltages, essentially using the process technology of MOS-based IGBTs with a monolithically integrated n-channel MOSFET were also described in the above publication by Rosensaft et al.

The object of the present invention is to describe a semiconductor switch that can be used as a circuit breaker even for high operating voltages and enables rapid, automatic turn-off in the event of overcurrents.

DESCRIPTION OF THE INVENTION

The object is achieved with the monolithically integrated semiconductor switch according to patent claim 1. Advantageous variants of the semiconductor switch are the subject matter of the dependent patent claims or are indicated in the following description and exemplary embodiments.

The proposed monolithically integrated semiconductor switch consists of two semiconductor elements, wherein the control principle for at least one of the semiconductor elements corresponds to the control principle of a junction gate field effect transistor (JFET). The semiconductor switch is constituted by a dual thyristor. In this arrangement, the source or emitter electrode of the first field effect transistor is short-circuited to the source or emitter electrode of the second field effect transistor. The source or emitter region of the first field effect transistor and the source or emitter region of the second field effect transistor are preferably adjacent to one another. The drain or collector electrode of the first field effect transistor is connected to a first electrical terminal of the semiconductor switch, the drain or collector electrode of the second field effect transistor is connected to a second electrical terminal of the semiconductor switch. The two electrical terminals represent the anode and the cathode terminal. In a first variation of the suggested semiconductor switch, the gate or base electrodes of both field effect transistors are short circuited to the first electrical terminal. The well region of the second field effect transistor is short-circuited to both source or emitter electrodes of both field effect transistors. The well region of the first field effect transistor is short-circuited to the second electrical terminal. The channel region of the field effect transistors is located between the gate electrode and the well region in each case. In a second alternative variant of the suggested semiconductor switch, only the gate or base electrode of the first field effect transistor is short-circuited to the first electrical terminal. The gate or base electrode of the second field effect transistor may then be connected with an external gate control.

In both alternative variants, at least one of the field effect transistors is a JFET, and the other is either a JFET or a bipolar field effect transistor (BIFET). Accordingly, the first field effect transistor may be a p-JFET and the second field effect transistor may be a n-JFET or n-BIFET, wherein the first electrical terminal is then the cathode terminal and the second electrical terminal is the anode terminal. The first field effect transistor may also be a n-JFET. In this case, a p-JFET or a p-BIFET is used as the second field effect transistor, wherein the first electrical terminal is then the anode terminal and the second electrical terminal is the cathode terminal.

The monolithic integration enables a compact design of the suggested semiconductor switch—referred to in the following as "circuit breaker" based on its preferred use. The flow of current through this circuit breaker may be switched off automatically if the anode voltage or anode current rises above a given value for each. An additional control and monitoring electronic arrangement is not needed for this. The threshold values for the anode voltage and anode current may be set by the dimensioning of the field effect transistors. If the device is designed with a separately or externally controllable gate electrode for the second field effect transistor, the threshold values may also be adjusted during operation. The suggested solution was inspired by the finding that the $n^+$-gate of the field effect transistor on the cathode side can be protected from the anode voltage by connecting the anode voltage not to the $n^+$-gate but to the substrate contact and setting the $n^+$-gate to cathode potential. Consequently, unlike the last mentioned prior art, for controllability of the gate anode potential an isolating layer is not needed between the gate potential and the source electrode which is routed over it. Instead, the voltage is dissipated entirely via pn-junctions. In this prior art, the gate electrode cannot be used, because there would be no separation of the cathode or anode potential from the gate of the respective other transistor.

In this way, with the suggested circuit breaker the maximum blocking strength is no longer determined by the maximum voltage that can be applied to the gate electrode, but rather by the dimensioning of the drift region. Monolithically integrated circuit breakers with blocking strengths up to 10 kV (silicon) or 200 kV (silicon carbide) can be achieved by appropriate selection of the thickness and doping of the drift region.

If a p-doped collector region is used in the design with a BIFET instead of a JFET, additional charge carriers are injected into the drift region in the switched on state. This makes for low static losses even with very high blocking strengths.

When silicon carbide is used, it is further possible to produce semiconductor elements or a circuit breaker based thereon for operation with very high reverse voltages, so that their use can also be considered in applications at the medium voltage level (10 kV or 20 kV) and in the High-Voltage Direct Current (HVDC) transmission field. Whereas at the medium voltage level a functionality with AC voltage (with polarity reversal) must be provided, only operation with one polarity is needed in HVDC technology. Unlike mechanical circuit breakers, most of all the rapid actuation speed represents a considerable advantage.

The suggested monolithically integrated semiconductor switch or circuit breaker with regenerative turn-off behaviour is particularly suitable for use in safeguarding electrical grids and systems. Examples include the protection of DC voltage systems, used for example to supply energy to buildings, as power supplies for electrical drives from a DC voltage intermediate circuit or similar applications. Of course, this is not an exhaustive list. In particular, the suggested semiconductor switch may be used not only as a circuit breaker, but also for other switching applications.

BRIEF DESCRIPTION OF THE DRAWINGS

In the following, the suggested monolithically integrated circuit breaker will be explained again in greater detail with reference to exemplary embodiments thereof and in conjunction with the drawings.

WAYS TO REALISE THE INVENTION

Figure 1:
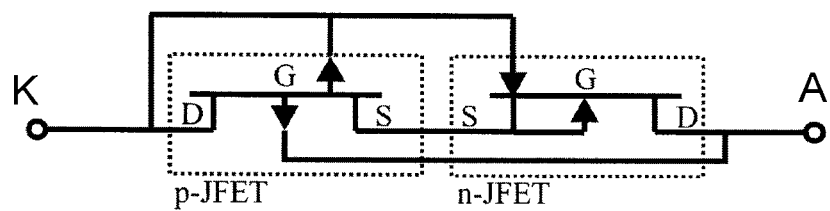
FIG. 1 shows an equivalent circuit diagram of a first example of a circuit breaker according to the invention.

FIG. 1 shows an equivalent circuit diagram of an example of the integrated circuit breaker suggested according to the invention, consisting of two JFETs. The first JFET has a p-doped channel region and thus represents a p-JFET. On the other hand, the second JFET has a n-doped channel region and thus represents a n-JFET. The source electrodes S of both of these JFETs and the well region of the n-JFET are short-circuited. Additionally, gate electrode G of the n-JFET, gate electrode G of the p-JFET and drain electrode D of the p-JFET are short-circuited via cathode C. In contrast, the well region of the p-JFET is short-circuited to anode A. In this way, the operating state of the p-JFET is determined by the potential at the anode. On the other hand, the operating state of the n-JFET is determined by the potential difference across the p-doped channel region between the drain electrode D and the source electrode S of the p-JFET. In the normal operating state, a positive voltage is applied to anode A and a negative voltage is applied to cathode C. In this operating state, the current flows from the cathode to the anode across the p-doped channel region of the p-JFET and the n-doped channel region of the n-JFET. Depending on the anode voltage, the p-doped channel region of the p-JFET is depleted and the potential difference between the source electrode and the gate electrode of the n-JFET increases. Above a certain anode voltage, this potential difference causes the depletion of the n-doped channel region of the n-JFET, and the flow of current across the monolithically integrated circuit breaker is turned off. The suggested solution was inspired by the finding that the $n^+$-gate of the transistor on the cathode side can be protected from the anode voltage by connecting the anode voltage not to the $n^+$-gate but to the substrate contact and setting the $n^+$-gate to cathode potential.

Figure 2:
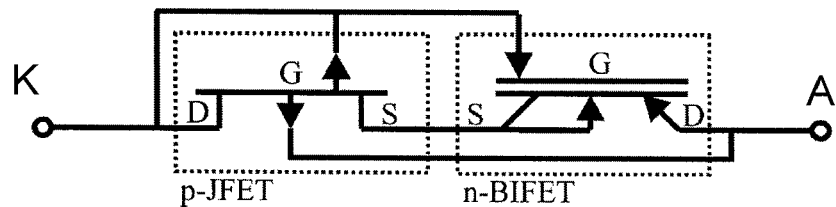
FIG. 2 shows an equivalent circuit diagram of a second example of a circuit breaker according to the invention.

In a further exemplary variation of the suggested circuit breaker, the n-JFET of the previous example is replaced with a n-BIFET, as is represented in the equivalent circuit diagram of FIG. 2. The circuitry and mode of operation are not changed thereby.

Figure 3:
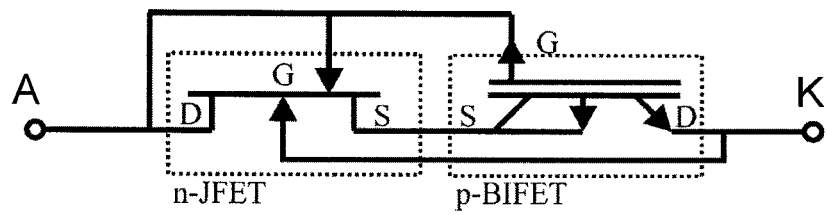
FIG. 3 shows an equivalent circuit diagram of a third example of a circuit breaker according to the invention.

Another possible way to realise the circuit breaker according to the invention is shown in the equivalent circuit diagram of FIG. 3. In this example, the p-JFET of the exemplary embodiment of FIG. 2 is replaced with a n-JFET and the n-BIFET is replaced with a p-BIFET. The anode and cathode must then be swapped correspondingly.

Figure 4:
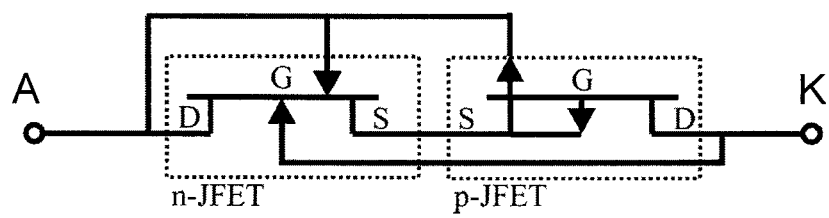
FIG. 4 shows an equivalent circuit diagram of a fourth example of a circuit breaker according to the invention.

Finally, FIG. 4 shows an equivalent circuit diagram of still another possible variation of the field effect transistors used in the suggested circuit breaker. In comparison with the previous embodiment of FIG. 3, the p-BIFET in this case is replaced with a p-JFET. The rest of the circuitry is identical to the respective previous embodiments, as is evident from FIGS. 1 to 4.

Figure 5:
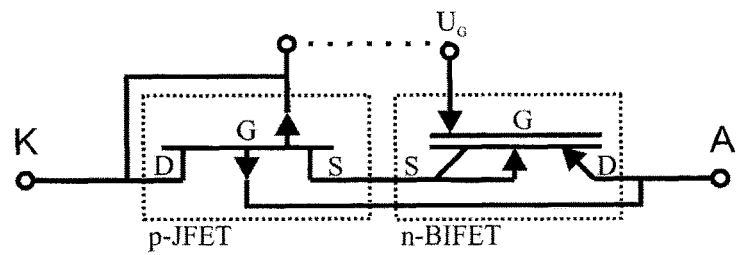
FIG. 5 shows an equivalent circuit diagram of a fifth example of a circuit breaker according to the invention.

The suggested circuit breaker may also be realised with a circuit arrangement as illustrated for exemplary purposes in the equivalent circuit diagram of FIG. 5. Unlike the variant of FIG. 2, in this case, gate electrode G of the n-BIFET is not short-circuited to gate electrode G of the p-JFET and cathode C. Instead, in this variant, gate electrode G of the n-BIFET may be connected to an external gate control. This makes it possible to influence the breakover voltage and the breakover current of the circuit breaker selectively by applying a gate voltage. This kind of influence is not possible with the circuit breaker of the last mentioned prior art, since in that case the gate potentials of the JFETs are only influenced via semiconductor regions. This modification as shown in figure may also be made analogously with the embodiments of FIGS. 1, 3 and 4.

Figure 6:
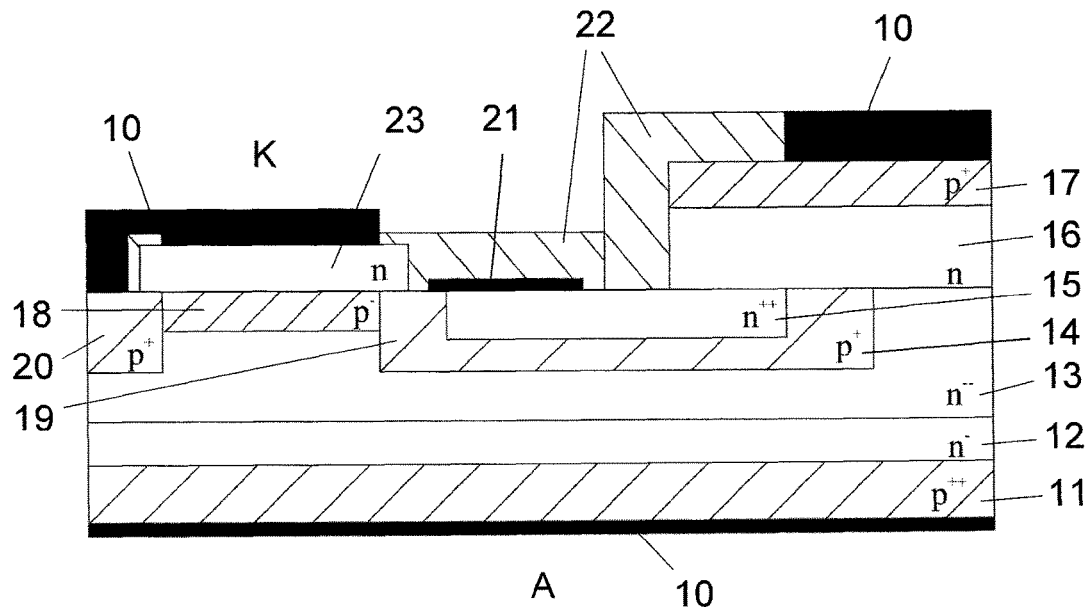
FIG. 6 shows a schematic cross-section through an exemplary design of the circuit breaker according to the invention.

FIG. 6 shows an exemplary realisation of the circuit breaker represented in the equivalent circuit diagram of FIG. 5. This isolator switch is realised by monolithic integration of a lateral p-JFET and a vertical n-BIFET. Accordingly, the monolithically integrated circuit breaker consists of p-doped collector region 11, n-doped field stop region 12, n-doped drift region 13, p-doped well region 14, n-doped emitter region 15 of the BIFET, n-doped channel region 16 of the n-BIFET, p-doped gate region 17 of the n-BIFET, p-doped channel region 18 of the lateral p-JFET and p-doped source region 19 and p-doped drain region 20 of the lateral p-JFET, as shown in FIG. 6. Emitter region 15 and well region 14 of the n-BIFET as well as source region 19 of the p-JFET are connected to each other via an ohmic layer 21. This ohmic layer 21 is isolated from metallisation 10 of cathode C by an isolating layer 22. The ohmic connection between the drain electrode and the n-doped gate region 23 of the p-JFET is realised through the metallisation 10 of cathode C. Drift region 13 also represents the well region of the p-JFET.

In the configuration shown, it would be possible to realise monolithic integration of a n-JFET and a p-JFET by substituting the p-doped collector region 11 with an n-doped collector region. Preferably silicon or silicon carbide, and particularly preferably the 4H polytype of silicon carbide is used as the semiconductor substrate. The circuit illustrated in FIG. 2 can be realised with such a construction if the metallisation above the drain electrode and the n-doped gate region 23 of the p-JFET is extended to the p-doped gate region 17 of the n-BIFET so that it creates an ohmic connection between these regions.

Figure 7:
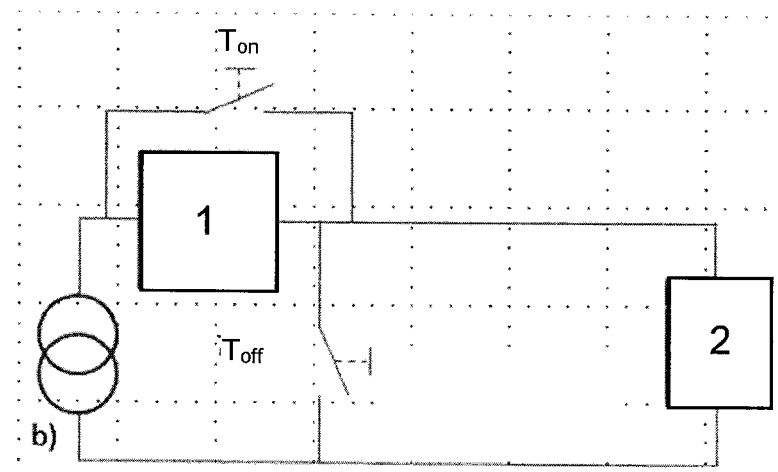
FIG. 7 shows an exemplary use of the circuit breaker according to the invention as a protection device against overcurrents in a power grid application.
Figure 8:
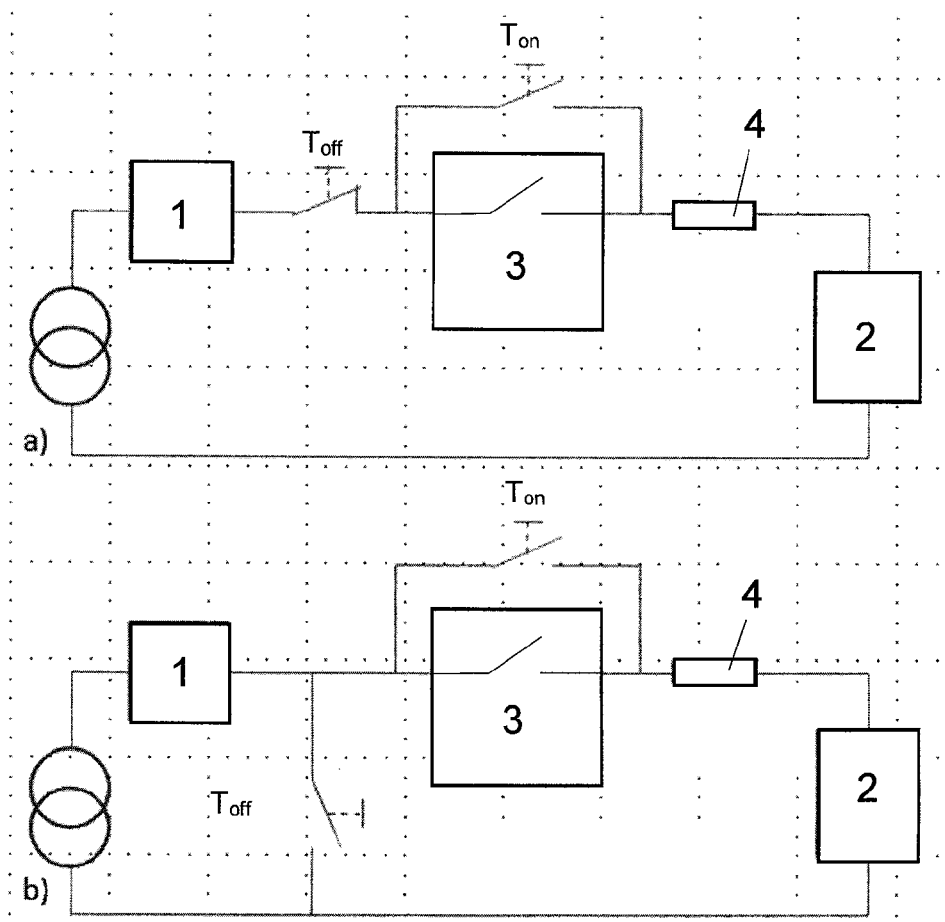
FIG. 8 shows an exemplary use of the circuit breaker according to the invention in a hybrid arrangement as a protection device against overcurrents in a power grid application.

FIGS. 7 and 8 show exemplary applications of the circuit breaker according to the invention as a protective circuit in a power distribution grid. Its integration in the grid and the design of the on/off pushbuttons are consistent with the typical state of the art in the respective network (voltage level) and are only represented symbolically here as pushbuttons $T_{in}/T_{off}$. FIG. 7 shows the suggested circuit breaker 1 as a protection element against overcurrents (e.g. load short circuit) in a grid application (DC or AC). Load 2 is also represented only symbolically in this figure.

The configuration with the suggested circuit breaker 1 represented in FIG. 8 addresses the need for a mechanical circuit breaker in electrical power distribution lines. In certain cases, this is prescribed by law and assures the mechanical disconnection of grid and load 2. FIG. 8 shows a hybrid circuit breaker for this purpose, consisting in this example of a latching mechanical or magnetic contactor 3 with a relay 4 and the suggested circuit breaker 1. Load 2 is again represented only schematically in this figure as well. Subdiagram A shows the situation with a disconnecting Off pushbutton $T_{off}$ and subdiagram B shows the situation with a closing Off pushbutton $T_{off}$.

REFERENCE LIST

1 circuit breaker
2 Load
3 Mechanical/magnetic contactor
4 Relay
10 Metallisation
11 p-doped collector region
12 n-doped field stop region
13 n-doped drift region
14 p-doped well region
15 n-doped emitter region
16 n-doped channel region (BIFET)
17 p-doped gate region
18 p-doped channel region (JFET)
19 p-doped source region (BIFET)
20 p-doped drain region
21 Ohmic layer
22 Isolating layer
23 n-doped gate region
A Anode
D Drain
G Gate
C Cathode
S Source
$T_{on}$ Pushbutton
$T_{off}$ Pushbutton

The invention claimed is:

1. A semiconductor switch having a first and a second monolithically integrated field effect transistor, of which one has an n-doped channel and one has a p-doped channel, in which
    a source or emitter electrode of the first field effect transistor is short circuited to a source or emitter electrode of the second field effect transistor,
    a drain or collector electrode of the first field effect transistor is connected to a first electrical terminal of the semiconductor switch, and
    a drain or collector electrode of the second field effect transistor is connected to a second electrical terminal of the semiconductor switch,
    wherein
    a well region of the second field effect transistor is short-circuited to the source or emitter electrodes of both field effect transistors,
    a well region of the first field effect transistor is short-circuited to the second electrical terminal of the semiconductor switch, and
    a gate or base electrode of the first field effect transistor is short-circuited to the first electrical terminal of the semiconductor switch and a gate or base electrode of the second field effect transistor is short-circuited to the first electrical terminal of the semiconductor switch or is arranged so as to be externally controllable.

2. The semiconductor switch according to claim 1, characterised in that
    the source or emitter electrode of the first field effect transistor and the source or emitter electrode of the second field effect transistor are arranged adjacent to each other.

3. The semiconductor switch according to claim 1, characterised in that
    the first field effect transistor is a p-JFET, the first electrical terminal is a cathode terminal and the second electrical terminal is an anode terminal.

4. The semiconductor switch according to claim 3, characterised in that
    the second field effect transistor is a n-JFET.

5. The semiconductor switch according to claim 3, characterised in that
    the second field effect transistor is a n-BIFET.

6. The semiconductor switch according to claim 1, characterised in that
    the first field effect transistor is a n-JFET, the first electrical terminal is an anode terminal and the second electrical terminal is a cathode terminal.

7. The semiconductor switch according to claim 6, characterised in that
    the second field effect transistor is a p-JFET.

8. The semiconductor switch according to claim 6, characterised in that
    the second field effect transistor is a p-BIFET.

9. The semiconductor switch according to claim 1, characterised in that
    both field effect transistors are monolithically integrated in a semiconductor substrate made from silicon or silicon carbide.

10. The semiconductor switch according to claim 1, characterised in that both field effect transistors are monolithically integrated in a semiconductor substrate made from the 4H polytype of silicon carbide.

\* \* \* \* \*

UNITED STATES PATENT AND TRADEMARK OFFICE
CERTIFICATE OF CORRECTION

PATENT NO. : 9,893,057 B2
APPLICATION NO. : 15/585198
DATED : February 13, 2018
INVENTOR(S) : Andreas Huerner and Tobias Erlbacher It is certified that error appears in the above-identified patent and that said Letters Patent is hereby corrected as shown below:

On the Title Page

Column 1, Item (30) should be included to read:
-- (30) Foreign Application Priority Data
May 6, 2016 (DE) .............. 10 2016 207 859.3 --.

Signed and Sealed this
Twenty-second Day of May, 2018

Andrei Iancu
*Director of the United States Patent and Trademark Office*